United States Patent
Bahali et al.

(10) Patent No.: US 8,805,590 B2
(45) Date of Patent: Aug. 12, 2014

(54) FAN SPEED CONTROL OF RACK DEVICES WHERE SUM OF DEVICE AIRFLOWS IS GREATER THAN MAXIMUM AIRFLOW OF RACK

(75) Inventors: Sumanta K. Bahali, Cary, NC (US); Vinod Kamath, Raleigh, NC (US); Jimmy G. Foster, Sr., Morrisville, NC (US)

(73) Assignee: International Business Machines Corporation, Armonk, NY (US)

(*) Notice: Subject to any disclaimer, the term of this patent is extended or adjusted under 35 U.S.C. 154(b) by 536 days.

(21) Appl. No.: 12/647,357

(22) Filed: Dec. 24, 2009

(65) Prior Publication Data
US 2011/0160916 A1    Jun. 30, 2011

(51) Int. Cl.
*G05D 7/06*    (2006.01)

(52) U.S. Cl.
USPC ............ 700/282; 700/300; 700/19; 700/299; 700/277

(58) Field of Classification Search
None
See application file for complete search history.

(56) References Cited

U.S. PATENT DOCUMENTS

| | | | |
|---|---|---|---|
| 4,795,088 A * | 1/1989 | Kobayashi et al. | 236/49.3 |
| 5,071,065 A * | 12/1991 | Aalto et al. | 236/49.3 |
| 5,249,297 A | 9/1993 | Brockmann | |
| 5,251,320 A | 10/1993 | Kuzawinski | |
| 5,307,409 A | 4/1994 | Driscoll | |
| 5,398,244 A | 3/1995 | Mathews | |
| 5,483,656 A | 1/1996 | Oprescu | |
| 5,579,524 A | 11/1996 | Kikinis | |
| 5,652,893 A | 7/1997 | Ben-Meir | |
| 5,719,800 A | 2/1998 | Mittal | |
| 5,724,592 A | 3/1998 | Garner | |
| 5,752,050 A | 5/1998 | Hernandez | |
| 5,764,913 A | 6/1998 | Jancke | |
| 5,777,897 A * | 7/1998 | Giorgio | 700/299 |
| 5,787,294 A | 7/1998 | Evoy | |
| 5,987,614 A | 11/1999 | Mitchell | |
| 6,029,006 A | 2/2000 | Alexander | |
| 6,029,119 A * | 2/2000 | Atkinson | 702/132 |
| 6,266,735 B1 | 7/2001 | Isobe | |
| 6,301,527 B1 | 10/2001 | Butland | |
| 6,377,874 B1 | 4/2002 | Ykema | |
| 6,477,483 B1 | 11/2002 | Scarlat | |
| 6,525,895 B2 | 2/2003 | Wakui | |
| 6,535,382 B2 | 3/2003 | Bishop et al. | |
| 6,549,826 B1 * | 4/2003 | Pouchak et al. | 700/276 |
| 6,564,274 B1 | 5/2003 | Heath | |

(Continued)

OTHER PUBLICATIONS

C.D. Patel et al., "Smart chip, system and data center enabled by advanced flexible cooling resources," Procs. of 21st IEEE SEMI-THERM Symposium, year 2005.

*Primary Examiner* — Kavita Padmanabhan
*Assistant Examiner* — Christopher E Everett
(74) *Attorney, Agent, or Firm* — Thomas E. Tyson

(57) ABSTRACT

Computing devices have fan speeds governing airflows through the computing devices. The rack has a maximum airflow associated with a cooling component for the rack. The computing devices transmit their current airflows. A sum of the current airflows is determined. Where the sum is greater than the maximum airflow, the fan speeds of one or more selected computing devices are decreased. The fan speeds of lower priority computing devices may be reduced before the fan speeds higher priority computing devices are reduced. Fan speed reduction may be achieved in a centralized manner, by employing a centralized management component, or in a decentralized manner, without employing a centralized management component.

11 Claims, 9 Drawing Sheets

(56) References Cited

U.S. PATENT DOCUMENTS

| Patent No. | Date | Name | Ref |
|---|---|---|---|
| 6,564,328 B1 | 5/2003 | Grochowski | |
| 6,564,332 B1 | 5/2003 | Nguyen | |
| 6,643,771 B2 | 11/2003 | Tsushima | |
| 6,701,446 B2 | 3/2004 | Tsern | |
| 6,708,278 B2 | 3/2004 | Howard | |
| 6,802,014 B1 | 10/2004 | Suurballe | |
| 6,836,849 B2 | 12/2004 | Brock | |
| 6,931,553 B1 | 8/2005 | Plante | |
| 6,936,767 B2 * | 8/2005 | Kleinecke et al. | 174/50 |
| 7,017,827 B2 * | 3/2006 | Shah et al. | 236/1 B |
| 7,031,870 B2 * | 4/2006 | Sharma et al. | 702/130 |
| 7,054,721 B2 * | 5/2006 | Malone et al. | 700/300 |
| 7,096,147 B1 * | 8/2006 | Low | 702/132 |
| 7,212,403 B2 | 5/2007 | Rockenfeller | |
| 7,337,018 B2 | 2/2008 | Espinoza-Ibarra et al. | |
| 7,347,774 B2 | 3/2008 | Aronstam et al. | |
| 7,403,385 B2 | 7/2008 | Boone et al. | |
| 7,421,368 B2 * | 9/2008 | Dalton et al. | 702/130 |
| 7,467,311 B2 | 12/2008 | Bahali | |
| 7,606,640 B2 * | 10/2009 | Hirai et al. | 700/300 |
| 7,630,795 B2 * | 12/2009 | Campbell et al. | 700/300 |
| 7,682,234 B1 * | 3/2010 | Beitelmal et al. | 454/256 |
| 7,726,582 B2 * | 6/2010 | Federspiel | 236/49.3 |
| 7,742,844 B2 * | 6/2010 | Coxe, III | 700/300 |
| 7,766,733 B2 * | 8/2010 | Kasahara et al. | 454/184 |
| 7,885,795 B2 * | 2/2011 | Rasmussen et al. | 703/5 |
| 7,890,219 B2 * | 2/2011 | Tuma | 700/300 |
| 7,991,592 B2 * | 8/2011 | VanGilder et al. | 703/1 |
| 7,995,339 B2 * | 8/2011 | Bash et al. | 361/692 |
| 8,032,331 B2 * | 10/2011 | Dalton et al. | 702/186 |
| 8,140,195 B2 * | 3/2012 | Matteson et al. | 700/299 |
| 8,140,196 B2 * | 3/2012 | Rozzi et al. | 700/300 |
| 8,180,495 B1 * | 5/2012 | Roy | 700/278 |
| 8,190,273 B1 * | 5/2012 | Federspiel et al. | 700/17 |
| 8,212,501 B2 * | 7/2012 | Artman et al. | 318/66 |
| 8,229,713 B2 * | 7/2012 | Hamann et al. | 703/1 |
| 2002/0007463 A1 | 1/2002 | Fung | |
| 2002/0062454 A1 | 5/2002 | Fung | |
| 2003/0037268 A1 | 2/2003 | Kistler | |
| 2003/0055969 A1 | 3/2003 | Begun | |
| 2003/0061448 A1 | 3/2003 | Rawson | |
| 2003/0065961 A1 | 4/2003 | Koenen | |
| 2003/0131119 A1 | 7/2003 | Noonan | |
| 2005/0102544 A1 | 5/2005 | Brewer | |
| 2005/0241810 A1 * | 11/2005 | Malone et al. | 165/122 |
| 2006/0161311 A1 | 7/2006 | Vinson et al. | |
| 2006/0168416 A1 | 7/2006 | Kessels | |
| 2006/0168975 A1 * | 8/2006 | Malone et al. | 62/180 |
| 2006/0184287 A1 | 8/2006 | Belady | |
| 2007/0005994 A1 | 1/2007 | Bahali | |
| 2008/0104985 A1 | 5/2008 | Carlsen | |
| 2008/0112571 A1 * | 5/2008 | Bradicich et al. | 381/73.1 |
| 2008/0178615 A1 * | 7/2008 | Yoon et al. | 62/79 |
| 2008/0272887 A1 * | 11/2008 | Brey et al. | 340/10.1 |
| 2008/0282117 A1 | 11/2008 | Partani et al. | |
| 2008/0296009 A1 * | 12/2008 | Ziarnik et al. | 165/287 |
| 2008/0307238 A1 * | 12/2008 | Bieswanger et al. | 713/300 |
| 2009/0205416 A1 | 8/2009 | Campbell et al. | |
| 2009/0256512 A1 * | 10/2009 | Begun et al. | 318/471 |

* cited by examiner

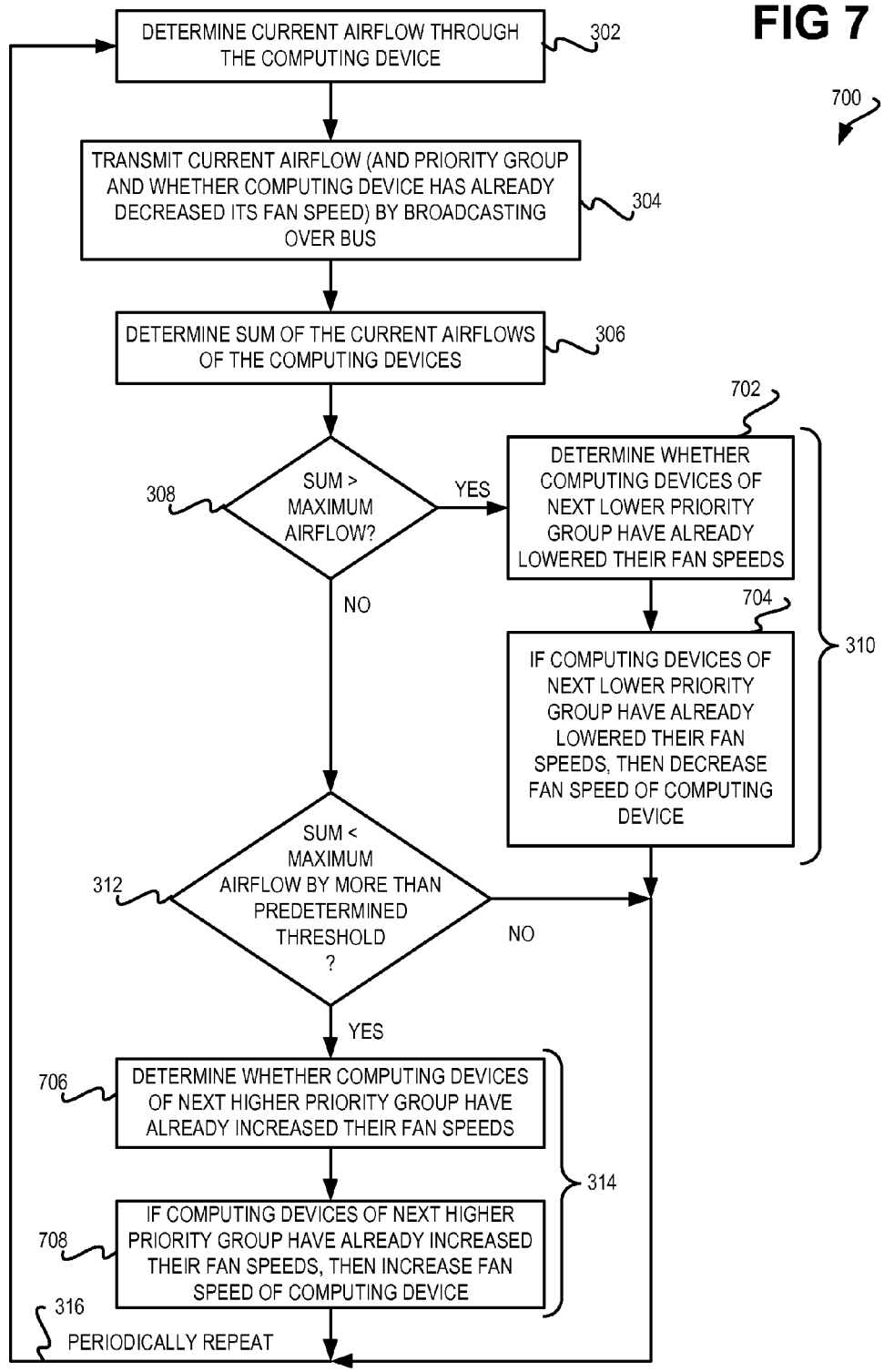

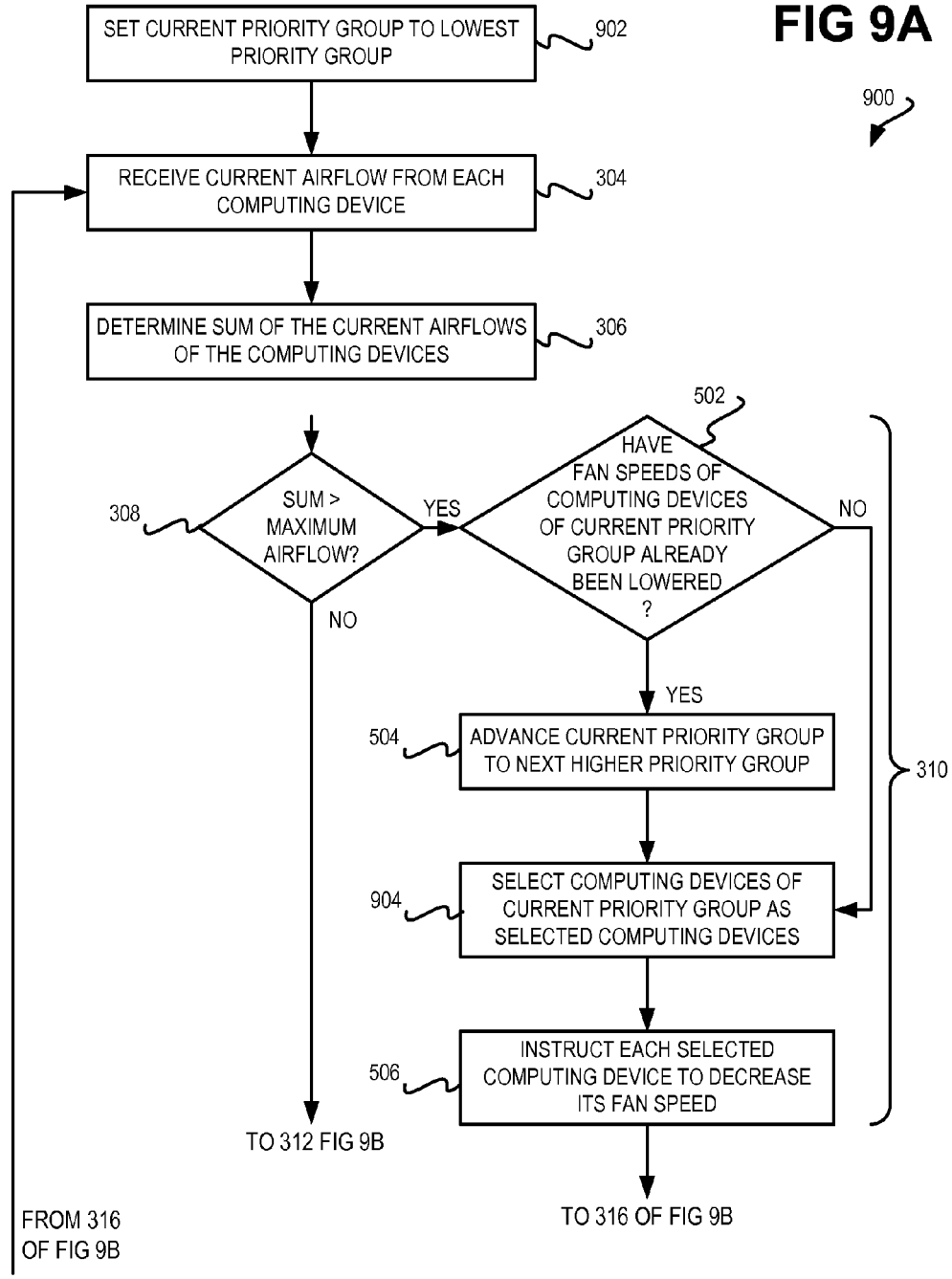

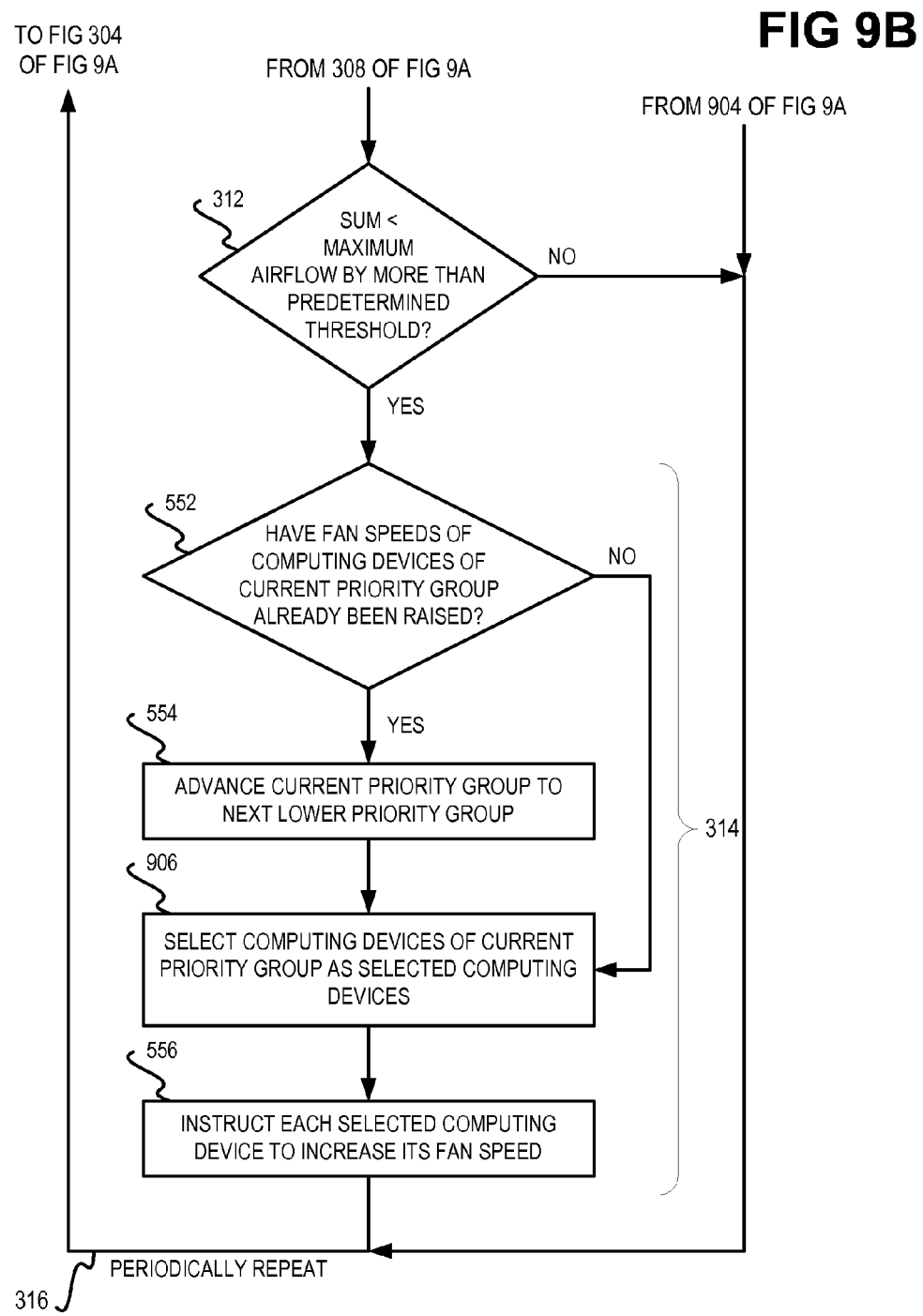

FAN SPEED CONTROL OF RACK DEVICES WHERE SUM OF DEVICE AIRFLOWS IS GREATER THAN MAXIMUM AIRFLOW OF RACK

FIELD OF THE INVENTION

The present invention relates generally to a rack that has a number of computing devices installed therein. The present invention relates more particularly to ensuring that the computing devices installed within the rack are properly cooled by a cooling component for the rack.

BACKGROUND OF THE INVENTION

In data centers and other locations in which there are large numbers of computing devices, such as server computing devices, the devices are typically installed within racks. The devices are installed over the heights of the racks in a stacked manner. Rack computing devices are generally more space efficient than computing devices that cannot be installed within racks.

The internal components of computing devices generate heat. Therefore, the computing devices typically include fans to draw in cool air and to exhaust hot air. There typically are cooling components for the racks, to cool the hot air exhausted by the fans. Without proper cooling, the exhausted hot air may not be sufficiently cooled, and the internal components may overheat.

SUMMARY OF THE INVENTION

A method of an embodiment of the invention includes computing devices installed within a rack transmitting their current airflows. The rack has a maximum airflow associated with a cooling component for the rack. The computing devices have fan speeds governing airflows through the computing devices. The method determines the sum of the current airflows through the computing devices. Where the sum is greater than the maximum airflow associated with the cooling component for the rack, the method decreases the fan speeds of one or more selected computing devices.

A system of an embodiment of the invention includes a rack, computing devices installed within the rack, and a component. The rack has a maximum airflow associated with a cooling component for the rack. The computing devices have fan speeds governing airflows through the computing devices. The computing devices transmit their current airflows. The component determines a sum of the current airflows through the computing devices. Where the sum is greater than the maximum airflow, the component decreases the fan speeds of one or more selected computing devices.

A computing device of an embodiment of the invention includes a housing, hardware within the housing, and a component implemented by the hardware. The housing is installed within a rack along with one or more other computing devices. The rack has a maximum airflow associated with a cooling component for the rack. The component transmits its current airflow. Where the sum of the current airflow through the computing device and the current airflows through the other computing devices is greater than the maximum airflow, and where the computing device has been selected for fan speed reduction, the component decreases the fan speed of the computing device. The fan speed governs airflow through the computing device.

A computer-readable storage medium of an embodiment of the invention has computer-readable code, including first, second and third computer-readable code, stored thereon for execution by a processor of a first computing device. The first code receives current airflows of second computing devices installed within a rack, from the second computing devices. The second computing devices have fan speeds governing airflows through the second computing devices. The rack has a maximum airflow associated with a cooling component for the rack. The second code determines the sum of the current airflows through the second computing devices. The third code selects one or more selected second computing devices, and instructs each selected computing device to decrease the fan speed thereof, where the sum is greater than the maximum airflow.

BRIEF DESCRIPTION OF THE DRAWINGS

FIG. 7 is a flowchart of a method for ensuring that the cooling component is able to sufficiently cool the hot air exhausted by the computing devices within the system of FIG. 6, according to an embodiment of the invention.

FIGS. 9A and 9B are flowcharts of a method for ensuring that the cooling component is able to sufficiently cool the hot air exhausted by the computing devices within the system of FIG. 8, according to an embodiment of the invention.

DETAILED DESCRIPTION OF THE DRAWINGS

Figure 1:
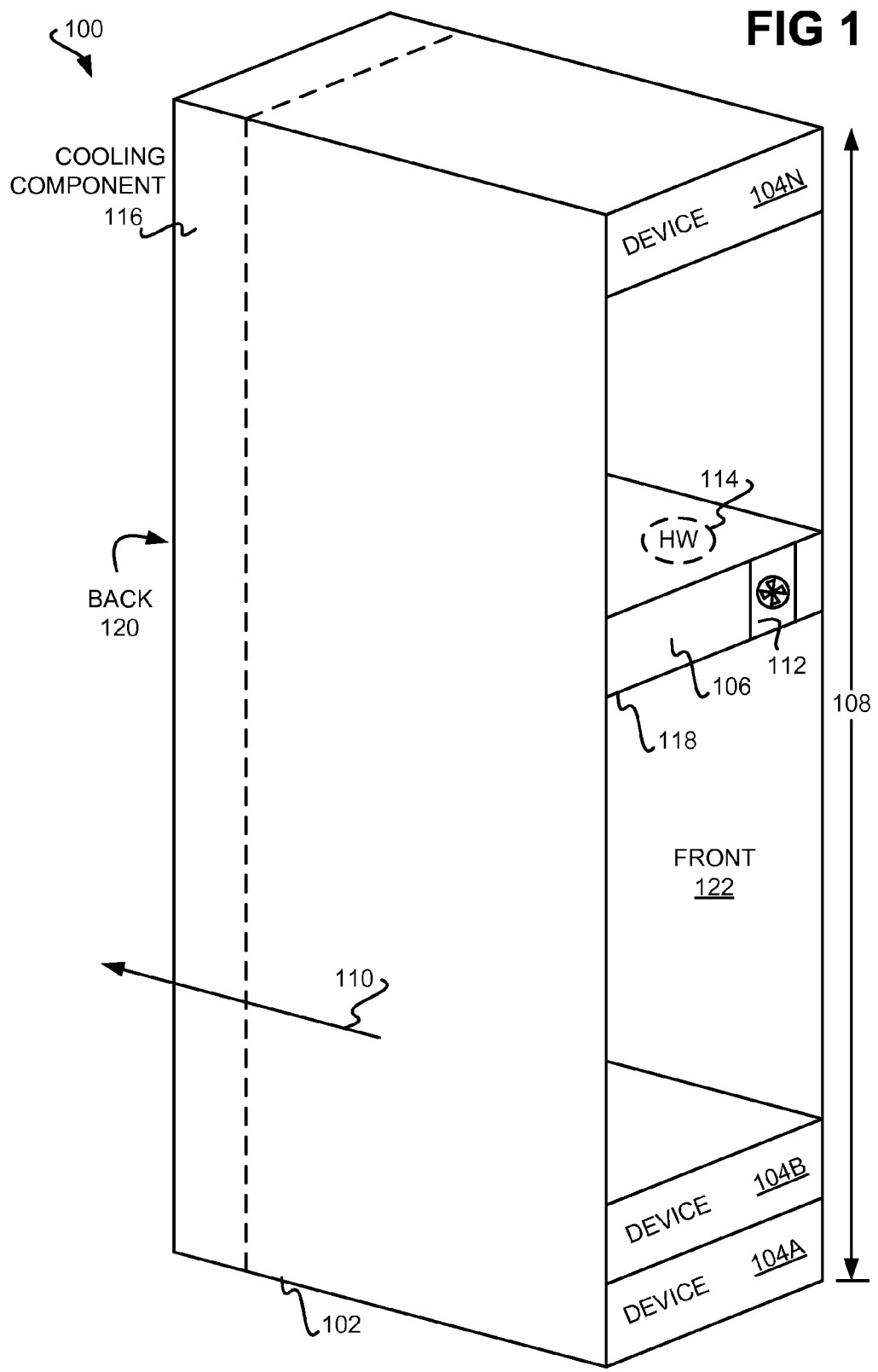
FIG. 1 is a diagram of a system of computing devices installed within a rack for which there is a cooling component, according to an embodiment of the present invention.

As noted in the background section, a cooling component for a rack cools the hot air exhausted by the fans of the computing devices installed within the rack. The rack may have a maximum airflow associated with this cooling component. The maximum airflow associated with the cooling component is the maximum rate at which the cooling component can draw in air and still ensure that the computing devices are sufficiently cooled.

Each computing device installed within the rack has airflow. The airflow of a computing device is governed by one or more fans of the device, and is the rate at which the computing device draws air into and exhausts air out of the computing device. Hardware of computing devices, such as processors, memory, and hard disk drives, generate heat. The greater the heat generated by this hardware, the greater the fans have to rotate to provide airflow sufficient to properly exhaust this heat.

However, if sum of the airflows of the computing devices installed within the rack exceeds the maximum allocated airflow of the rack, the cooling component may not be able to ensure that the computing devices are properly cooled. As such, the hardware of the computing devices may overheat and fail. To ensure that this situation does not occur, the cooling component may be specified so that the rack has a maximum airflow that is greater than or equal to the sum of all the maximum potential airflows of the devices installed within the rack.

However, in actuality not all the computing devices are likely to be at their maximum potential airflows at any given point in time. As such, specifying a cooling component that can sufficiently cool the hot air exhausted by all the devices within a rack when all the devices are at their maximum airflows can result in a cooling component for the rack that provides greater cooling capability than is necessary most of the time. Cooling components with greater cooling capabilities are typically more expensive, consume more power, and occupy more space, than cooling components with lesser cooling capabilities.

Embodiments of the invention overcome these disadvantages. The computing devices installed within a rack transmit their current airflows. Where the sum of the current airflows is greater than the maximum airflow associated with the cooling component for the rack, the fan speeds of one or more selected computing devices are reduced so that this maximum airflow is not exceeded.

Although reducing the fan speeds of selected computing devices within the rack can result in these devices undesirably throttling their processors or other hardware to generate less heat, the cooling component can be specified so that this situation does not occur most of the time. In the relatively rare instances where the maximum airflow of the rack is exceeded, however, overheating the computing devices is still prevented. As such, a cooling component having lesser cooling capability can be specified, resulting in cost and space savings, with limited downside.

FIG. 1 shows a system 100, according to an embodiment of the invention. The system 100 includes a rack 102. Installed within the rack 102 are a number of computing devices 104A, 104B, . . . , 104N, which are collectively referred to as the computing devices 104, and which include the computing device 106. The system 100 includes a cooling component 116 for the rack 102. The rack 102 has a front 122 and a back 120, as well as a height 108.

The computing devices 104 can be installed within the rack 102 such that they are stacked over the height 108 of the rack 102. The computing devices 104 can be server computing devices, or other types of computing devices. The computing device 106 is representative of all the computing devices 104. The computing device 106 includes a housing 118 that is attached to the rack 102. The computing device 106 includes hardware 114 within the housing 118. Examples of hardware 114 include processors, memory, hard disk drives, and other types of hardware. At least some of the hardware 114 generates heat within the computing device 106, which is exhausted so that the hardware 114 does not overheat and potentially fail.

Therefore, the computing device 106 includes a fan 112. While the fan 112 is depicted in FIG. 1 as being installed within the computing device 106 at the front 122 of the rack 102, in another embodiment the fan 112 may be installed at the back 120 of the rack 102. There may be more than one fan 112, located on the same end (i.e., front or back) of the computing device 106, or on different ends. The fan 112 draws the air at the front 122 of the rack 102, and exhausts this air, as has been heated by the hardware 114, at the back 120 of the rack 102, as indicated by the arrow 110.

The cooling component 116 for the rack 102 is specifically depicted as being installed at the back 120 of the rack 102. The cooling component 116 in this embodiment cools the hot air exhausted by the fan 112. However, in other embodiments, the cooling component 116 may be disposed at other locations on the rack 102, or the component 116 may not be located on the rack 102 at all. The cooling component 116 may be a heat exchanger, a computer room air conditioner (CRAC), and/or another type of component. In some embodiments, the inlet air may be cooled instead of the exhaust or discharge air. In some embodiments, the exhaust or discharge air may be expelled from the system 100 as a whole and not recirculated. In some embodiments, the maximum permitted airflow for the rack 102 may be seasonally adjusted to adjust for the lower or higher outdoor air temperature.

Figure 2:
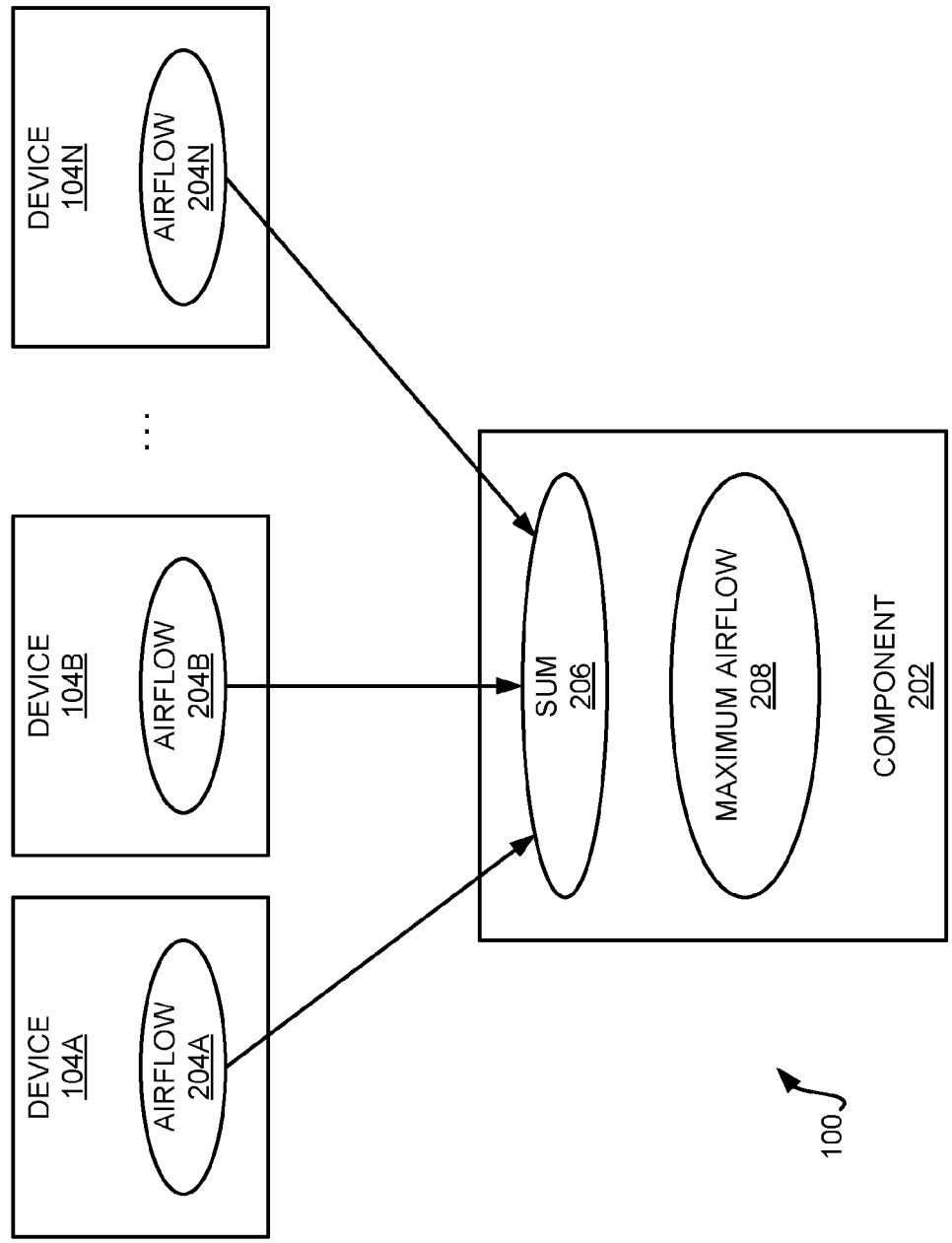
FIG. 2 is a block diagram of the system of FIG. 1, according to an embodiment of the present invention.

FIG. 2 shows a block diagram of the system 100, according to an embodiment of the invention. The system 100 again includes the computing devices 104, and also includes a component 202. How the component 202 can be implemented in different embodiments of the invention is presented later in the detailed description.

The computing devices 104 have associated current airflows 204A, 204B, . . . , 204N, which are collectively referred to as the current airflows 204. The current airflow 204 of a computing device 104 is the flow of air through the device 104, resulting from the fans of the computing device 104 drawing into and exhausting air out of the device 104. The computing devices 104 transmit their current airflows 204 to the component 202. That is, each computing device 104 transmits the numeric value of its airflow 204, according to a predetermined unit of measure, to the component 202.

The component 202 in turn determines the sum 206 of all the airflows 204. The component 202 compares the sum 206 against a maximum airflow 208 that is permitted within the rack 102. The maximum airflow 208 is associated with the cooling component 116. Specifically, the maximum airflow 208 is the maximum sum 206 of the airflows 204 of all the computing devices 104 that is permitted by the cooling component 116 such that the component 116 can still properly cool the hot air exhausted by the devices 104. If the sum 206 exceeds the maximum airflow 208, then the component 116 may not be able to properly cool the air exhausted by the computing devices 104, resulting in potential failure of the hardware of the devices 104.

Therefore, the component 202 compares the sum 206 against the maximum airflow 208. If the sum 206 is greater than the maximum airflow 208, then the component 202 selects one or more of the computing devices 104. The fan speeds of the selected computing devices 104 are decreased. By decreasing the speeds at which the fans of the selected computing devices 104 rotate, the airflows 204 of these selected devices 104 decrease. As such, the sum 206 of the airflows 204 of all the computing devices 104 desirably decreases so that it is less than the maximum airflow 208.

Figure 3:
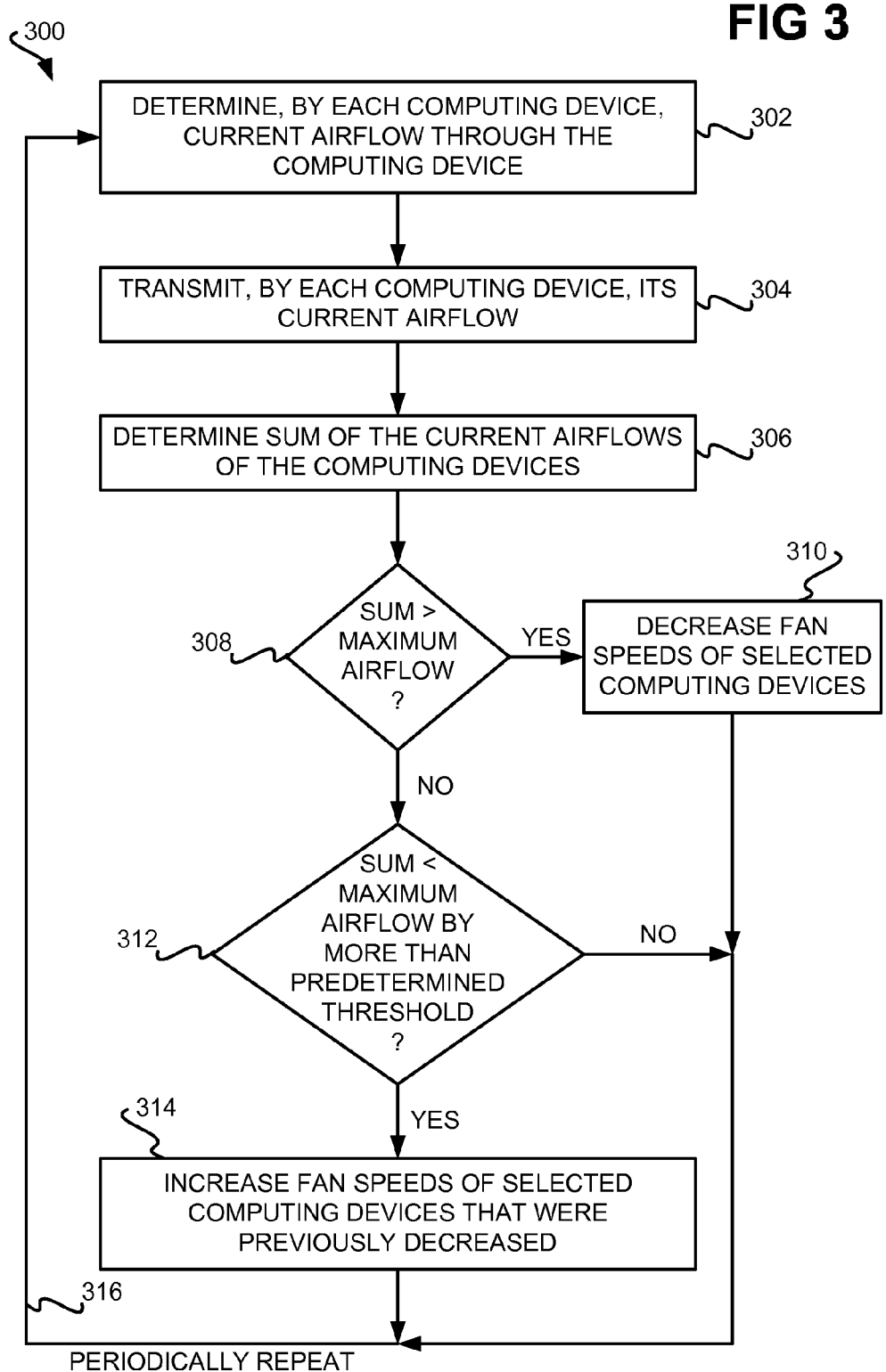
FIG. 3 is a flowchart of a method for ensuring that the cooling component is able to sufficiently cool the hot air exhausted by the computing devices within the system of FIGS. 1 and 2, according to an embodiment of the present invention.

FIG. 3 shows a method 300 that is performed in relation to the system 100 of FIG. 2, according to an embodiment of the invention. Each computing device 104 determines its current airflow 204 (302). For example, a computing device 104 may be able to determine the current pulse-width modulation (PWM) of its fan. A previously constructed table for the computing device 104 can then be referenced to look up airflow by PWM of the fan. Other approaches also can be used for the computing devices 104 to determine their current airflows 204.

Each computing device 104 than transmits its current airflow 204 (304). Specific manners by which the computing devices 104 transmit their current airflows 204 are described later in the detailed description. The component 208 determines the sum 206 of the current airflows 204 (306), after having received them. If the sum 206 is greater than the maximum airflow 208 (308), then the fan speeds of one or more selected computing devices 104 are decreased (310). Decreasing the fan speeds of the selected computing devices 104 desirably reduces the airflows 204 of the selected devices 104, such that the sum 206 is correspondingly reduced as well. How the selected devices 104 are chosen in part 310 in one embodiment is described in detail later in the detailed description.

In one embodiment, the fan speed of a selected computing device 104 is decreased to less than the actual current fan speed of the device 104. In this situation, the computing device 104 will have to immediately have its hardware generate less heat, because there is less airflow to exhaust this heat. In general, the greater the heat generated by the hardware of a computing device 104, the greater the airflow that is needed to sufficiently exhaust this heat from the device 104.

In this situation, therefore, the computing device 104 may have to immediately throttle one or more of its hardware, so that the hardware generates less heat. For example, throttling a processor means reducing the frequency at which the processor executes instructions. By executing fewer instructions in a given period of time, the processor generates less heat. As another example, a hard disk drive may be able to be throttled by rotating its platters at a lower rate to generate less heat. As a third example, memory may be throttled by reducing the frequency at which the memory can be accessed, resulting in the memory generating less heat. In all these examples, performance of the computing device 104 decreases.

In another embodiment, the fan speed of a selected computing device 104 that is decreased is the maximum fan speed of the device 104, and not necessarily the actual current fan speed of the device 104. In this situation, the computing device 104 may not have to immediately have its hardware generate less heat, if the current fan speed is still less than the reduced maximum fan speed. However, at some point in the future, the computing device 104 may have to throttle the hardware, if the current fan speed does begin to exceed the reduced maximum fan speed.

For example, the absolute maximum fan speed may be X, the current fan speed may be Y, and the reduced maximum fan speed may be Z. The current fan speed Y may approach the absolute maximum fan speed X only when, for instance, the processor of the computing device 104 in question is operating at 100% capacity. The current fan speed Y may approach the reduced maximum fan speed Z when, by comparison, the processor is operating at just 85% capacity. Therefore, when the current fan speed Y approaches the reduced fan speed Z, the processor may have to be throttled so that it does not exceed 85% capacity.

If the sum 206 is not greater than the maximum airflow 208 (308), however, then the method 300 determines whether the sum 206 is less than the maximum airflow 208 by more than a predetermined threshold (312). For example, the method 300 may determined whether the sum 206 is less than the maximum airflow 208 by at least ten percent, or another predetermined threshold. In this case, the fan speeds of one or more selected computing devices can again be increased (314). This is because the sum 206 of the airflows 204 of all the computing devices 104 is sufficiently lower than the maximum airflow 208 that is permitted, such that fan speed reduction may no longer be necessary. The computing devices that are selected in part 314 to have their fan speeds increased can be different than the computing devices that are selected in to have their fan speeds decreased in part 310. How the selected devices 104 are chosen in part 314 in varying embodiments is described in detail later in the detailed description. However, in one embodiment, the fan speed of any computing device 104 that was previously decreased in part 310 is increased in part 314.

From either part 310 or part 314, the method 300 is periodically repeated at part 302 (316). Therefore, periodically the airflows 204 of the computing devices 104 are determined and transmitted. In each iteration of the method 300, if the sum 208 of the airflows 204 is greater than the maximum airflow 208, then the fan speeds of one or more selected computing devices 104 are decreased. Once the sum 208 of the airflows 204 is less than the maximum airflow 208 by more than a predetermined threshold, the fan speeds of any computing devices 104 that were decreased are again increased.

Figure 4:
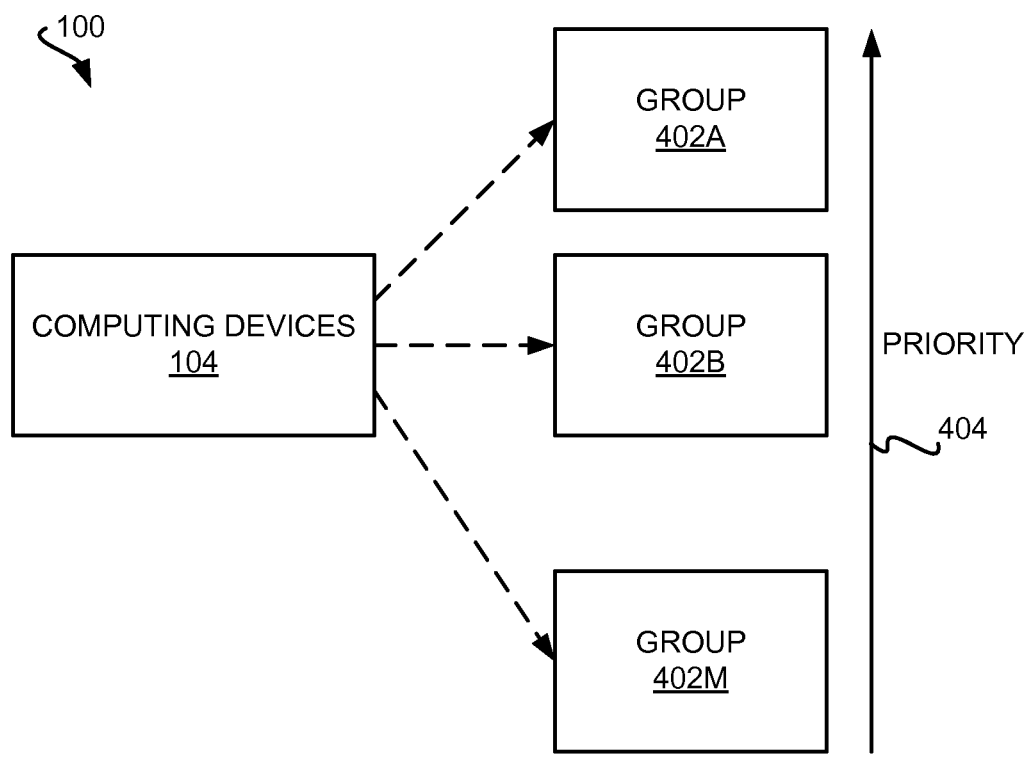
FIG. 4 is a diagram of the system of FIG. 2, in which the computing devices have been prioritized into priority groups, according to an embodiment of the present invention.

FIG. 4 shows the system 100 in which the computing devices 104 are prioritized, according to an embodiment of the invention. The system 100 of FIG. 4 includes a number of priority groups 402A, 402B, . . . , 402M, collectively referred to as the priority groups. The priority groups 402 are ordered as indicated by the arrow 404, such that the group 402A has the highest priority, and the group 402M has the lowest priority. Priority here means that the order in which the computing devices have their fan speeds reduced, such that lower priority computing devices have their fan speeds reduced before higher priority computing devices do.

The computing devices 104 are organized over the priority groups 402. That is, each computing device 104 is assigned to one of the priority groups 402. There may be some priority groups 402 that have no computing devices 104 assigned thereto. Other priority groups 402 may have one computing device 104 assigned thereto, or more than one computing device 104 assigned thereto.

Figure 5A:
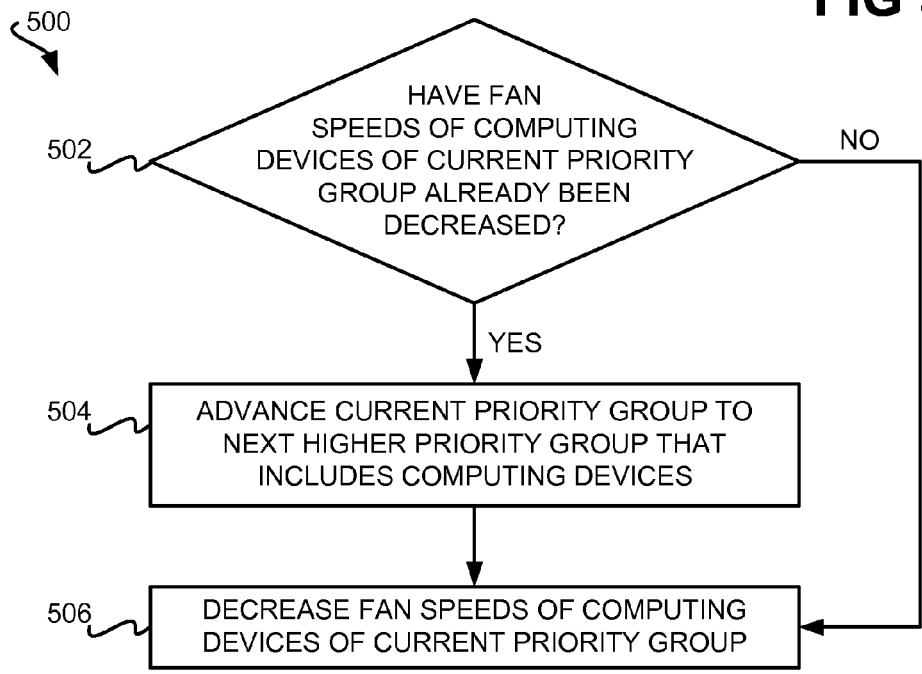
FIGS. 5A and 5B are flowcharts of methods that can implement parts of the method of FIG. 3, according to differing embodiment of the present invention.

FIG. 5A shows a method 500 that can implement part 310 of the method 300 when the computing devices 104 have been assigned to the priority groups 402, according to an embodiment of the invention. That is, the method 500 is performed to decrease the fan speeds of selected computing devices 104 in part 310 of the method 300. The method 500 presumes that there is a current priority group, which is set to the lowest priority group 402M before the method 300 is performed for the first time.

If the fan speeds of the computing devices 104 of the current priority group have not yet been decreased (502), then the method 500 decreases the fan speeds of all the computing devices 104 within the current priority group (506), such as by a predetermined amount or percentage. However, if the fan speeds of the computing devices 104 of the current priority group have already been decreased (502), then the method 500 first advances the current priority group to the next higher priority group to which at least one computing device 104 has been assigned (504), before decreasing the fan speeds of all the computing devices 104 within the current priority group (506). In this way, the selected computing devices 104 that are to have their fan speeds decreased can be chosen in one embodiment of the invention.

It is noted that in part 502, if the current priority group already is the highest priority group that contains at least one computing device 104, then the current priority group may be reset to the lowest priority group that includes at least one computing device 104, in one embodiment. That is, if in the method 500 the current priority group is already the highest priority group to which at least one computing device 104 has been assigned, then the current priority group cannot be advanced to a next higher priority group that contains at least one device 104 in part 504. In this case, the current priority group may be reset back to the lowest priority group that contains at least one device 104, such that the fan speeds of the computing devices 104 are iteratively decreased even further, beginning with the devices 104 within this lowest priority group.

Figure 5B:
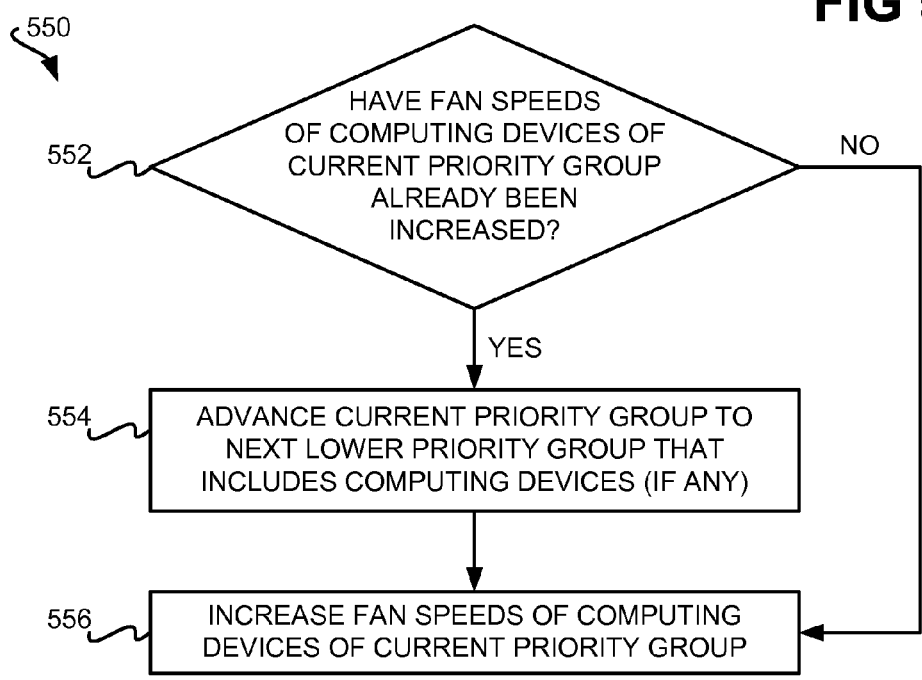

FIG. 5B shows a method 550 that can implement part 314 of the method 300 when the computing devices 104 have been assigned to the priority groups 402, according to an embodiment of the invention. That is, the method 550 is performed to increase the fan speeds of selected computing devices 104 in part 314 of the method 300. The method 500 presumes that there is a current priority group, which is set to the priority group 402 that includes the computing devices 104 that have had their fan speeds most recently decreased, pursuant to the method 500 of FIG. 5A.

If the fan speeds of the computing devices 104 of the current priority group have not yet been increased (552), then the method increases the fan speeds of all the computing devices 104 within the current priority group (556), such as by a predetermined amount or percentage. However, if the fan speeds of the computing devices 104 of the current priority group have already been increased (552), then the method 550 first advances the current priority group to the next lower priority group to which at least one computing device 104 has been assigned (554). The fan speeds of all the computing devices 104 within the current priority group are then increased as before (556). In this way, the selected computing devices 104 that are to have their fan speeds increased can be chosen in one embodiment of the invention. In one embodiment, if the current priority group already is the lowest priority group that contains at least one computing device 104, then the fan speeds of none of the devices 104 may be increased in part 556.

Alternatively, in another embodiment, if the current priority group already is the lowest priority group that contains at least one computing device 104, then the current priority group may be set to the highest priority group that includes at least one computing device 104 in part 554. That is, if in the method 550 the current priority group is already the lowest priority to which at least one computing device 104 has been assigned, then the current priority group cannot be advanced to a next lower priority group that contains at least one device 104 in part 554. In this case, the current priority group may be set to the highest priority group that contains at least one device 104, such that the fan speeds of the computing devices 104 are iteratively increased even further, beginning with the devices 104 within this lowest priority group.

Figure 6:
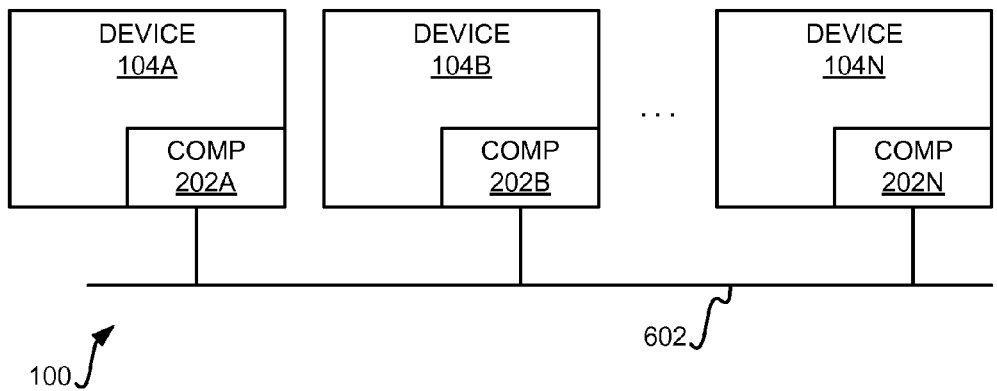
FIG. 6 is a diagram of the system of FIG. 2, in which the component is decentralized over the computing devices, according to an embodiment of the invention.

FIG. 6 shows the system 100, according to an embodiment of the invention in which the component 202 of FIG. 2 is decentralized or distributed. Specifically, the computing devices 104 include corresponding components 202A, 202B, ..., 202N, collectively referred to as the components 202, and which implement the component 202 of FIG. 2 in a decentralized or distributed manner. The components 202 are implemented by the hardware of the computing devices 104, and may be service processors, system management controllers, baseboard management controllers, and/or other types of components. The components 202 are able to communicate with one another over a bus 602.

In the system 100 of FIG. 6, the component 202 of each computing device 104 periodically broadcasts its corresponding airflow 204 over the bus 602, and listens for the airflows 204 of the other computing devices 104 as are also broadcast over the bus 602. In response, the component 202 of each computing device 104 determines the sum 206 of all the airflows 204, and compares the sum 206 against the maximum airflow 208, which may be stored in the firmware of the component 202 or of the device 104. If the sum 206 is greater than the maximum airflow 208, each component 202 determines whether its computing device 104 is one that should have its fan speed lowered. If so, then each component 202 may reduce the fan speed of its computing device 104.

In this way, fan speed reduction is achieved in the system 100 of FIG. 6 in a decentralized or distributed manner, without employing a centralized management component, for instance. Rather, the component 202 of each computing device 104 calculates the sum 206, and determines whether the sum 206 is greater than the maximum airflow 208. If the sum 206 is greater than the maximum airflow 208, then the component 202 may (or may not) decrease the fan speed of its computing device 104, depending on whether the computing device 104 is one that should have its fan speed reduced, as is now described in detail for one embodiment of the invention.

FIG. 7 shows a method 700 that is performed in relation to the system 100 of FIG. 6, according to an embodiment of the invention. The method 700 further encompasses the prioritization of the computing devices 104, as has been described above in relation to FIGS. 4 and 5. However, in other embodiments of the invention, a decentralized and distributed approach for reducing computing device fan speeds can be employed that does not take into account or encompass any prioritization of the computing devices 104.

Like-numbered parts between the method 700 and the method 300 correspond to one another, but may be performed slightly differently in the method 700 as compared to the method 300. The method 700 is performed by each computing device 104 within the system 100, and more specifically is performed by the component 202 of each computing device 104 within FIG. 6. The method 700 is therefore described in relation to a representative given computing device 104 performing the method 700.

The given computing device 104 determines its current airflow 204 (302), as has been described above in relation to the method 300. The given computing device 104 transmits its current airflow 204, by broadcasting the current airflow 204 over the bus 602 (304). The priority group 402 to which the given computing device 104 belongs, and whether the given device 104 has already reduced its fan speed, are also broadcast over the bus 602 in part 304. The priority group 402 to which the given computing device 104 has been assigned may be stored in the firmware of the given device 104 or of the component 202 of the given device 104. That the given computing device 104 has already reduced its fan speed may be stored as a flag, where the flag is initially set to false, and is set to true when the given device 104 has reduced its fan speed. Alternatively, the given computing device 104 may have a counter that is incremented each time its fan speed is decreased and that is decremented each time its fan speed is increased.

The given computing device 104 calculates the sum 206 of the current airflows 204 of all the computing devices 104 (306), and compares the sum 206 to the maximum airflow 208 (308). Because all the computing devices 104 have broadcast their current airflows 204 over the bus 602, the given computing device 104 is able to retrieve the current airflows 204 of the other computing devices 104 by monitoring the bus 602, such as in accordance with a process known as snooping. In this same way, the given computing device 104 is able to determine the priority group 402 to which each other computing device 104 has been assigned, and whether each other computing device 104 has already decreased its fan speed or not.

If the sum 206 exceeds the maximum airflow 208 (308), then the given computing device 104 performs parts 702 and 704, which correspond to part 310 of the method 300. The given computing device 104 determines whether the computing devices 104 of the next lower priority group 402—i.e., the priority group that is immediately less than the priority group 402 of the current device 104—have already reduced their fan speeds (702). If the computing devices 104 of the next lower priority group 402 have already lowered their fan speeds, then the given computing device 104 decrease its fan speed (704), and sets the flag or increments the counter that has been described above in relation to part 304 of FIG. 7.

By comparison, if the computing devices 104 of the next lower priority group 402 have not decreased their fan speeds, the given computing device 104 does not decrease its fan speed, and instead waits for the computing devices of the next lower priority group to decrease their fan speeds first. However, if the given computing device 104 is part of the lowest priority group 402M, then the given computing device 104 will reduce its fan speed in part 704 if the given device 104 has not yet reduced its fan speed. In this case, the given device 104 may also set the flag or increment the counter that has been described above.

If the sum 206 does not exceed the maximum airflow 208 (308), and if the sum 206 is less than the maximum airflow 208 by more than a predetermined threshold (312), then the given computing device 104 performs parts 706 and 708, which correspond to part 314 of the method 300. The given computing device 104 determines whether the computing devices 104 of the next higher priority group 402—i.e., the priority group that is immediately greater than the priority group 402 of the current group 402 of the current device 104—have already increased their fan speeds (702). If the computing devices 104 of the next higher priority group 402 have already increased their fan speeds, then the given computing device 104 increases its fan speed (704). The given computing device 104 in question may also in part 704 clear the flag or decrement the counter that has been described above in relation to part 304 of FIG. 7. In the embodiment in which a counter is used, the given computing device 104 may increase its fan speed in 704 only if the counter is greater than zero.

From either part 310 or part 314, the method 700 is periodically repeated at part 302 (316). As noted above, the method 700 is performed by each computing device 104. In this way, then, the fan speeds of all the computing devices 104 can be lowered in an order in accordance with the priorities of the devices 104, in a distributed and decentralized manner. No centralized component is employed within the method 700. Rather, each computing device 104 is responsible itself for determining whether or not to lower its fan speed, based on the sum 206, the maximum airflow 208, and whether the computing devices 104 within the next lower priority group 402 have already decreased their fan speeds.

Figure 8:
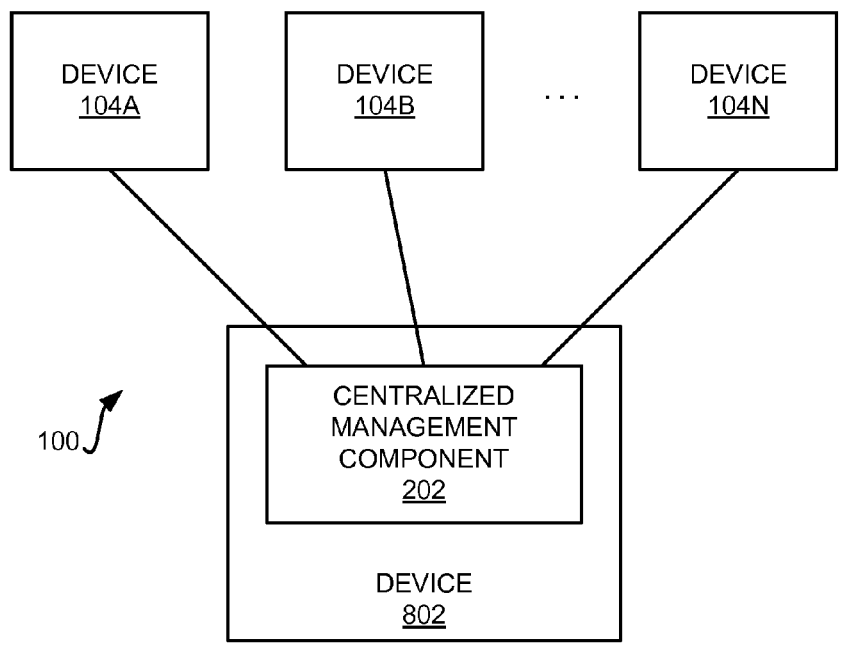
FIG. 8 is a diagram of the system of FIG. 2, in which the component is a centralized management component, according to an embodiment of the invention.

FIG. 8 shows the system 100, according to an embodiment of the invention in which the component 202 of FIG. 2 is a centralized management component. Specifically, there is a computing device 802 that includes the component 202, where no other computing device includes the component 202. As such, the component 202 is implemented in a centralized manner. The component 202 may be implemented by the hardware of the computing device 802. As depicted in FIG. 8, the computing device 802 may be a different computing device than the computing devices 104, and may not be installed on the rack 102.

In another embodiment, the computing device 802 may be one of the computing devices 104 that are installed on the rack 102. In such an embodiment, the computing device 104 that is to be the computing device 802 may be selected by entering the setup menu of the firmware of the device 104 and selecting an appropriate option. Alternatively, the computing device 104 that is to be the computing device 802 may be selected by remote management, cable management, or in another manner. In this embodiment, each of the computing devices 104 may be able to function as the computing device 802, but just one of the computing devices 104 is selected to actually function as the computing device 802.

In the system 100 of FIG. 8, each computing device 104 periodically transmits its corresponding airflow 204 to the centralized management component 202 of the computing device 802. For instance, service processors, system management controllers, and/or baseboard management controllers of the computing devices 104 may transmit the airflows 204 to the component 202 of the computing device 802, such as over a bus or over a network. In one embodiment, the computing devices 104 may not be able to communicate with one another, although in another embodiment, they still may be able to communicate with one another.

The centralized management component 202 of the computing device 802 receives all the airflows 204 from the computing devices 104. The component 202 determines the sum 206 of all the airflows 204 and compares the sum 206 against the maximum airflow 208, which may be stored in the firmware of the component 202 or of the device 802. If the sum 206 is greater than the maximum airflow 208, the computing device 802 chooses one or more selected computing devices 104, and instructs each selected computing device 104 to reduce its fan speed.

In this way, fan speed reduction is achieved in the system 100 of FIG. 8 in a centralized manner, by employing the centralized management component 202. None of the computing devices 104 (and none of their components) receive the airflows 204 of the other computing devices 104, calculate the sum 206, or determine whether the sum 206 is greater than the maximum airflow 208. Rather, this functionality is centralized at the computing device 802. The manner by which the computing device 802 can choose one or more selected computing devices 104 for fan speed reduction is now described in detail for one embodiment of the invention.

FIGS. 9A and 9B show a method 900 that is performed in relation to the system 100 of FIG. 8, according to an embodiment of the invention. The method 900 further encompasses the prioritization of the computing devices 104, as has been described above in relation to FIGS. 4 and 5. However, in other embodiments of the invention, a centralized approach for reducing computing device fan speeds can be employed that does not take into account or encompass any prioritization of the computing devices 104.

Like-numbered parts between the method 900 and the methods 300 and 500 correspond to one another, but may be performed slightly different in the method 900 as compared to the methods 300 and 500. The method 900 is performed by the computing device 802, and more specifically is performed by the centralized management component 202 of the computing device 802 within FIG. 8. The method 900 is therefore described in relation to the computing device 802 performing the method 900.

The computing device 802 initially sets a current priority group to the lowest priority group 402M the first time the method 900 is performed (902). From each computing device 104, the computing device 802 receives the airflow 204 of the computing device 104, as determined by the computing device 104 in question (304). Thus, the computing device 802 receives the airflows 204 of all the computing devices 104, as individually sent by each computing device 104.

The computing device 802 calculates the sum 206 of the current airflows 204 of all the computing devices 104 (306), and compares the sum 206 to the maximum airflow 208 (308). If the sum 206 exceeds the maximum airflow 208 (308), then the computing device 802 performs parts 502, 504, 506, and/or 904, which correspond to part 310 of the method 300. If the fan speeds of the computing devices 104 of the current priority group have not yet been decreased (502), then the computing device 802 selects the computing devices 104 of the current priority group as the selected computing devices that are to have their fan speeds reduced (506).

However, if the fan speeds of the computing devices 104 of the current priority group have already been decreased (502), then the computing device 802 first advances the current priority group to the next higher priority group to which at least one computing device 104 has been assigned (504). The computing device 802 then selects the computing devices 104 of this new current priority group as the selected computing devices 104 that are to have their fan speeds reduced (904). The computing device 802 instructs each selected computing device 104 to decrease its fan speed (506). For example, the computing device 802 may send an appropriate command to the service processor, baseboard manager controller, and/or system management controller of each selected computing device 104.

If the sum 206 does not exceed the maximum airflow 208 (308), and if the sum 206 is less than the maximum airflow 208 by more than a predetermined threshold (312), then the computing device 802 performs parts 552, 554, 556, and/or 906, which correspond to part 314 of the method 300. If the fan speeds of the computing devices 104 of the current priority group have not yet been increased (552), then the computing device 802 selects the computing devices 104 of the current priority group as the selected computing devices that are to have their fan speeds increased (556). However, if the fan speeds of the computing devices 104 of the current priority group have already been increased (552), then the computing device 802 first advances the current priority group to the next lower priority group to which at least one computing device 104 has been assigned (554). The computing device 802 then selects the computing devices 104 of this new priority group as the selected computing devices 104 that are to have their fan speeds increased (906). The computing device 802 instructs each selected computing device 104 to increase its fan speed (556). From either part 310 or part 314, the method 900 is periodically repeated at part 304 (316).

In this way, then, the fan speeds of all the computing devices 104 can be lowered in an order in accordance with the priorities of the devices 104, in a centralized manner. The computing device 802, such as the centralized management component 202 of the device 802, performs all parts of the method 900. None of the computing devices 104, and no components thereof, perform any part of the method 900 unless, it has been selected to be the computing device 802, in the embodiment where the computing device 802 is one of the computing device 104. As such, it can be said that just the computing device 802 determines whether or not to lower the fan speed of each computing device 802. This determination is not made by any computing device 104 in the method 900, unless it has been selected to be the computing device 802 in the embodiment where the computing device 802 is one of the computing devices 104.

The method 900 that has been described, as well as at least some parts of the methods 300, 500, and 700, may be implemented as computer-readable code. Such computer-readable code is stored on a computer-readable data storage medium. Examples of such computer-readable data storage media include volatile computer-readable media, such as dynamic random access memory and other types of volatile media, as well as non-volatile computer-readable media, such as hard disk drives, flash memory, and other types of non-volatile media. The computer-readable code is executed by a processor of a computing device, to result in the method(s) in question being performed.

It is finally noted that, although specific embodiments have been illustrated and described herein, it will be appreciated by those of ordinary skill in the art that any arrangement that is calculated to achieve the same purpose may be substituted for the specific embodiments shown. Other applications and uses of embodiments of the invention, besides those described herein, are amenable to at least some embodiments. This application is intended to cover any adaptations or variations of the present invention. Therefore, it is manifestly intended that this invention be limited only by the claims and equivalents thereof.

We claim:

1. A method comprising:

individually measuring a current airflow through each computing device of a plurality of computing devices installed within a rack having a maximum airflow associated within a cooling component for the rack, the computing devices having fan speeds governing airflows through the computing devices;

transmitting, by the computing devices the current airflows therethrough;

calculating a sum of the current airflows through the computing devices from the current airflows measured through the computing devices individually; and choosing one or more selected computing devices of the plurality of computing devices responsive to calculating that the sum of the current airflows is greater than the maximum airflows associated with the cooling component for the rack, as the computing devices that have current fan speeds less than maximum fan speeds at which the fans of the computing devices are operable; and decreasing the fan speeds of the selected computing devices so that the fans of the computing devices do not together exhaust more air into the rack than the cooling component can exhaust out of the rack, wherein each computing device, as a given computing device, has a fan to exhaust heat generated within the given computing device into the rack in which the given computing device is installed, wherein the cooling component for the rack is to exhaust the heat exhausted by the fans of the computing devices into the rack from the rack to outside the rack, the maximum airflow associated with the cooling component being a maximum flow of air that the cooling component is able to remove from the rack, wherein the maximum airflow associated with the cooling component for the rack is less than a sum of a maximum device airflow associated with each computing device individually, and wherein the selected computing devices do not immediately throttle one or more of processor instruction execution frequency, hard disk drive platter rotation rate, or memory access frequency, but are now configured to throttle the one or more of processor instruction execution frequency, hard disk drive platter rotation rate, or memory access frequency at a future point of time.

2. The method of claim 1, wherein transmitting the current airflow through each computing device comprises broadcasting the current airflow from each computing device to all other computing devices installed within the rack,
wherein calculating the sum of the current airflows is performed by each computing device, based on the current airflow broadcast by each computing device,
such that the fan speeds of the selected computing devices are decreased in a decentralized manner, without employing a centralized management component.

3. The method of claim 1, wherein transmitting the current airflow through each computing device comprises transmitting the current airflow from each computing device to a centralized management component,
wherein calculating the sum of the current airflows is performed by the centralized management component,
and wherein decreasing the fan speeds of the selected computing devices comprises:
instructing, by the centralized management component, each selected computing device to decrease the fan speed thereof,
such that the fan speeds of the selected computing devices are decreased in a centralized manner, by employing the centralized management component.

4. A system comprising:
a rack having a maximum airflow associated with a cooling component for the rack;
a plurality of computing devices installed within the rack, the computing devices having fan speeds governing airflows through the computing devices, each computing devices to individually measure and transmit a current airflow therethrough; and
a component, other than the cooling component, to calculate a sum of the current airflows through the computing devices from the current airflows individually measured through the computing devices, to choose one or more selected computing devices of the plurality of computing devices responsive to calculating that the sum of the current airflows is greater than the maximum airflows associated with the cooling component for the rack, as the computing devices that have current fan speeds less than maximum fan speeds at which the fans of the computing devices are operable, and to decrease the fan speeds of the selected computing devices so that the fans of the computing devices do not together exhaust more air into the rack than the cooling component can exhaust out of the rack,
wherein each computing device, as a given computing device, has a fan to exhaust heat generated within the given computing device into the rack in which the given computing device is installed,
wherein the cooling component for the rack is to exhaust the heat exhausted by the fans of the computing devices into the rack from the rack to outside the rack, the maximum airflow associated with the cooling component being a maximum flow of air that the cooling component is able to remove from the rack,
wherein the maximum airflow associated with the cooling component is less than a sum of a maximum device airflow associated with each computing device individually,
and wherein the selected computing devices do not immediately throttle one or more of processor instruction execution frequency, hard disk drive platter rotation rate, or memory access frequency, but are now configured to throttle the one or more of processor instruction execution frequency, hard disk drive platter rotation rate, or memory access frequency at a future point of time.

5. The system of claim 4, wherein the selected computing devices are first selected computing devices, and wherein the component is further to, where the sum of the current airflows is less than the maximum airflow associated with the cooling component for the rack, increase the fan speed of one or more second selected computing devices of the plurality of computing devices.

6. The system of claim 4, wherein the component comprises a component at each computing devices,
wherein each computing device is to broadcast the current airflow to all other computing devices installed within the rack,
and wherein each computing device is to calculate the sum of the current airflows,
such that the fan speeds of the selected computing devices are decreased in a decentralized manner, without employing a centralized management component.

7. The system of claim 4, wherein the component is a centralized management component,
wherein the computing devices are to transmit the fan speeds to the centralized management component,
wherein the centralized management component is to calculate the sum of the current airflows,
and wherein the centralized management component is to decrease the fan speeds of the selected computing devices by instructing each selected computing device to decrease the fan speed thereof,
such that the fan speeds of the selected computing devices are decreased in a centralized manner, by employing the centralized management component.

8. A computing device comprising:
a housing to be installed within a rack along with one or more other computing devices, the rack having a maximum airflow associated with a cooling component for the rack;
hardware within the housing; and,
a component, other than the cooling component, implemented by the hardware to individually measure and transmit a current airflow through the computing device, and to decrease a fan speed of the computing device where the computing device has been selected for fan speed reduction and has a current fan speed less than a maximum fan speed at which a fan of the computing device is operable to exhaust heat generated within the computing device into the rack, responsive to a calculation that a sum of the current airflow through the computing device and individually measured current airflows through the other computing devices is greater than the maximum airflow, so that the computing device and the other computing device do not together exhaust more air into the rack than the cooling component can exhaust out of the rack,
wherein each of the other computing devices, as a given computing device, has a fan to exhaust heat generated within the given computing device into the rack in which the given computing device is installed,
wherein the cooling component for the rack is to exhaust the heat exhausted by the fans of the computing device and the other computing devices into the rack from the rack to outside the rack, the maximum airflow associated with the cooling component being a maximum flow of air that the cooling component is able to remove from the rack, wherein the fan speed governs airflow through the computing device, wherein the maximum airflow associated with the cooling component is less than a sum of a maximum device airflow associated with each computing device individually, and wherein the computing device does not immediately throttle one or more of processor instruction execution frequency, hard disk drive platter rotation rate or memo access frequency, but is now configured to throttle the one or more of processor instruction execution frequency, hard disk drive platter rotation rate, or memory access frequency at a future point of time.

9. The computing device of claim 8, wherein the component is to broadcast the current airflow through the computing device to each other computing device, wherein the component is to receive the current airflow through each other computing device from each other computing device, and wherein the component is to calculate the sum of the current airflows.

10. The computing device of claim 8, wherein the component is to transmit the current airflow through the computing device to a centralized management component, and wherein the component is to receive an instruction from the centralized management component to decrease the fan speed of the computing device where the centralized management component has selected the computing device for fan speed reduction.

11. A data storage device having computer-readable code stored thereon for execution by a processor of a first computing device, the computer-readable code comprising:

first computer-readable code to receive current airflows of a plurality of second computing devices installed within a rack from the second computing devices as individually measured at the second computing devices, the second computing devices having fan speeds governing airflows through the second computing devices, the rack having a maximum airflow associated with a cooling component for the rack;

second computer-readable code to calculate a sum of the current airflows through the second computing devices from the current airflows measured through the second computing devices individually; and third computer-readable code to choose one or more selected computing devices of the second computing devices responsive to calculating that the sum of the current airflows is greater than the maximum airflows associated with the cooling component for the rack, as the second computing devices that have current fan speeds less than maximum fan speeds at which the fans of the second computing devices are operable to instruct each selected computing device to decrease the fan speed thereof, so that the second computing devices do not together exhaust more air into the rack than the cooling component can exhaust out of the rack, wherein each second computing device, as a given computing device, has a fan to exhaust heat generated within the given computing device into the rack in which the given computing device is installed, wherein the cooling component for the rack is to exhaust the heat exhausted by the fans of the second computing devices into the rack from the rack to outside the rack, the maximum airflow associated with the cooling component being a maximum flow of air that the cooling component is able to remove from the rack, wherein the maximum airflow associated with the cooling component is less than a sum of a maximum device airflow associated with each second computing device individually, and wherein the selected computing devices do not immediately throttle one or more of processor instruction execution frequency, hard disk drive platter rotation rate, or memo access frequency, but are now configured to throttle the one or more of processor instruction execution frequency, hard disk drive platter rotation rate, or memory access frequency at a future point of time.

* * * * *